United States Patent
Ee et al.

(10) Patent No.: US 11,811,335 B2
(45) Date of Patent: Nov. 7, 2023

(54) CONTACT PAD WITH ELECTRICAL CONNECTION STRUCTURE FOR CONNECTING A PIEZOELECTRIC ELEMENT AND AN ELECTRICAL CIRCUIT WITH A CONDUCTIVE ADHESIVE

(71) Applicant: Magnecomp Corporation, Murrieta, CA (US)

(72) Inventors: Kuen Chee Ee, Chino, CA (US); Peter Hahn, Bangkok (TH); David Glaess, Bangkok (TH); Keith A. Vanderlee, Midland, TX (US)

(73) Assignee: Magnecomp Corporation, Murrieta, CA (US)

( * ) Notice: Subject to any disclaimer, the term of this patent is extended or adjusted under 35 U.S.C. 154(b) by 27 days.

(21) Appl. No.: 17/464,248

(22) Filed: Sep. 1, 2021

(65) Prior Publication Data

US 2021/0399653 A1    Dec. 23, 2021

Related U.S. Application Data

(62) Division of application No. 16/701,059, filed on Dec. 2, 2019, now Pat. No. 11,121,647.

(60) Provisional application No. 62/779,378, filed on Dec. 13, 2018.

(51) Int. Cl.
| | |
|---|---|
| *H02N 2/00* | (2006.01) |
| *G11B 5/48* | (2006.01) |
| *H02N 2/06* | (2006.01) |
| *H02N 2/02* | (2006.01) |
| *H10N 30/87* | (2023.01) |

(52) U.S. Cl.
CPC ............ *H02N 2/0085* (2013.01); *G11B 5/483* (2015.09); *H02N 2/028* (2013.01); *H02N 2/065* (2013.01); *H10N 30/875* (2023.02)

(58) Field of Classification Search
None
See application file for complete search history.

(56) References Cited

U.S. PATENT DOCUMENTS

| | | | |
|---|---|---|---|
| 6,856,075 B1 * | 2/2005 | Houk et al. | ...... H01L 41/313 310/348 |
| 8,405,934 B2 | 3/2013 | Fuchino | |
| 8,508,889 B2 | 8/2013 | Kin | |
| 8,699,186 B1 * | 4/2014 | Hahn et al. | ...... G11B 5/4873 360/244.9 |
| 8,737,021 B2 | 5/2014 | Yonekura et al. | |
| 8,885,297 B1 | 11/2014 | Bjorstrom et al. | |

(Continued)

OTHER PUBLICATIONS

Office Action in U.S. Appl. No. 16/701,059, dated Aug. 24, 2020.
(Continued)

*Primary Examiner* — Craig A. Renner
(74) *Attorney, Agent, or Firm* — DLA Piper LLP (US)

(57) ABSTRACT

An electrical connection structure for connecting a piezoelectric element and an electrical circuit to each other with a conductive adhesive is described. The electrical connection structure includes an epoxy, a conductive component surrounded by the epoxy, and a trace feature implemented on top of the electrical connection structure. At least one depression feature can be implemented on top of the electrical connection structure to constrain the epoxy and the at least one conductive component.

5 Claims, 6 Drawing Sheets

(56) References Cited

U.S. PATENT DOCUMENTS

| | | | |
|---|---|---|---|
| 9,241,410 B2 | 1/2016 | Ishigaki et al. | |
| 9,311,938 B1 * | 4/2016 | Ee et al. | G11B 5/483 |
| 9,361,915 B1 | 6/2016 | Tobias et al. | |
| 9,406,314 B1 * | 8/2016 | Hahn et al. | G11B 5/483 |
| 11,121,647 B2 | 9/2021 | Ee et al. | |
| 2001/0000622 A1 * | 5/2001 | Reeh et al. | H01L 33/486 |
| | | | 257/98 |
| 2004/0217674 A1 | 11/2004 | Bianchini | |
| 2006/0043598 A1 | 3/2006 | Kirby et al. | |
| 2008/0224161 A1 * | 9/2008 | Takada | H01L 33/54 |
| | | | 257/98 |
| 2011/0141204 A1 | 6/2011 | Dolan et al. | |
| 2012/0007472 A1 | 1/2012 | Tai et al. | |
| 2016/0294040 A1 | 10/2016 | Blair | |

OTHER PUBLICATIONS

Office Action in U.S. Appl. No. 16/701,059, dated Feb. 10, 2021.
Notice of Allowance in U.S. Appl. No. 16/701,059, dated May 14, 2021.

* cited by examiner

CONTACT PAD WITH ELECTRICAL CONNECTION STRUCTURE FOR CONNECTING A PIEZOELECTRIC ELEMENT AND AN ELECTRICAL CIRCUIT WITH A CONDUCTIVE ADHESIVE

CROSS-REFERENCE TO RELATED APPLICATIONS

This application is a Divisional of U.S. application Ser. No. 16/701,059 filed on Dec. 2, 2019, which claims the benefit of U.S. Provisional Application No. 62/779,378 filed on Dec. 13, 2018, each of which is hereby incorporated by reference in its entirety.

FIELD

Embodiments of the disclosure relate to the field of suspensions for disk drives. More particularly, this disclosure relates to the field of multi-layer bond pads for a suspension.

BACKGROUND

A typical disk drive unit includes a spinning magnetic disk containing a pattern of magnetic storage medium ones and zeroes. The pattern of magnetic storage medium ones and zeroes constitutes the data stored on the disk drive. The magnetic disk is driven by a drive motor. The disk drive unit also includes a disk drive suspension to which a magnetic read/write head is mounted proximate a distal end of load beam. The "proximal" end of a suspension or load beam is the end that is supported, i.e., the end nearest to the base plate which is swaged or otherwise mounted to an actuator arm. The "distal" end of a suspension or load beam is the end that is opposite the proximal end, i.e., the "distal" end is the cantilevered end.

The suspension is coupled to an actuator arm, which in turn is coupled to a voice coil motor that moves the suspension arcuately in order to position the head slider over the correct data track on the data disk. The head slider is carried on a gimbal which allows the slider to pitch and roll so that it follows the proper data track on the disk, allowing for such variations as vibrations of the disk, inertial events such as bumping, and irregularities in the disk's surface.

Both single stage actuated disk drive suspensions and dual stage actuated (DSA) suspension are known. In a single stage actuated suspension, only the voice coil motor moves the suspension.

Suspensions for hard disk drives and other devices such as optical disk drives include a multi-layer circuit that carries signals between the read/write head, and possibly other parts of the suspension. For example, the signals can be carried between one or more microactuators located on the suspension, to the rest of the circuitry within the disk drive. Currently, it is common for suspension circuits to employ vias to form electrical connections between different layers. Vias may be used to connect trace layers such as in interleaved traces for low impedance/high bandwidth interconnects, to connect signal traces to bond pads, to connect a signal trace to a grounded portion of the stainless steel suspension, and to connect other circuit components.

SUMMARY

An electrical connection structure for connecting a piezoelectric element and a wiring member to each other with a conductive adhesive is described. The electrical connection structure includes an epoxy, a conductive component surrounded by the epoxy, and a copper trace feature implemented on top of the electrical connection structure. In an alternative embodiment, the electrical connection structure can include an epoxy, a conductive component surrounded by the epoxy, and a depression feature implemented on top of the electrical connection structure. The copper trace feature is in electrical contact with the conductive component to reduce thermal expansion. The copper trace feature also provides constraints to the epoxy and the conductive component.

In some embodiments, the copper trace feature includes a circular copper trace feature. The conductive component can include a vertical conductive component positioned in the center of the circular copper trace feature. In an alternative embodiment, the copper trace feature can include two elongated copper trace features arranged alongside one another. The conductive component can include a vertical conductive component positioned between the two elongated copper trace features and a horizontal conductive component abutting the two elongated copper trace features.

In some embodiments, the depression feature includes a circular depression feature. In an alternative embodiment, the depression feature can include multiple torus depression features. Furthermore, the depression feature can include multiple elongated depression features arranged alongside one another. Moreover, the depression feature can include multiple elongated depression features arranged in a grid layout.

A dual stage actuated assembly is also provided. The dual stage actuated assembly includes a piezoelectric microactuator mounted near a first end of the dual stage actuated assembly and a flexure mounted near a second end of the dual stage actuated assembly. The flexure includes an electrical circuit which includes a copper contact pad configured to carry a driving voltage to the at least one piezoelectric microactuator. The copper contact pad includes an epoxy, a conductive component surrounded by the epoxy, and a copper trace feature implemented on top of the electrical connection structure. In an alternative embodiment, the copper contact pad can include an epoxy, a conductive component surrounded by the epoxy, and a depression feature implemented on top of the electrical connection structure, wherein the at least one copper trace feature is in electrical contact with the at least one conductive component to reduce thermal expansion.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

In order to describe the manner in which the advantages and features of the disclosure can be obtained, embodiments of the present disclosure are described with reference to specific examples illustrated in the appended drawings. These drawings depict only example aspects of embodiments of the present disclosure, and are therefore not to be considered as limiting of its scope. The principles are described and explained with additional specificity and detail through the use of the following drawings.

DETAILED DESCRIPTION

Figure 1:
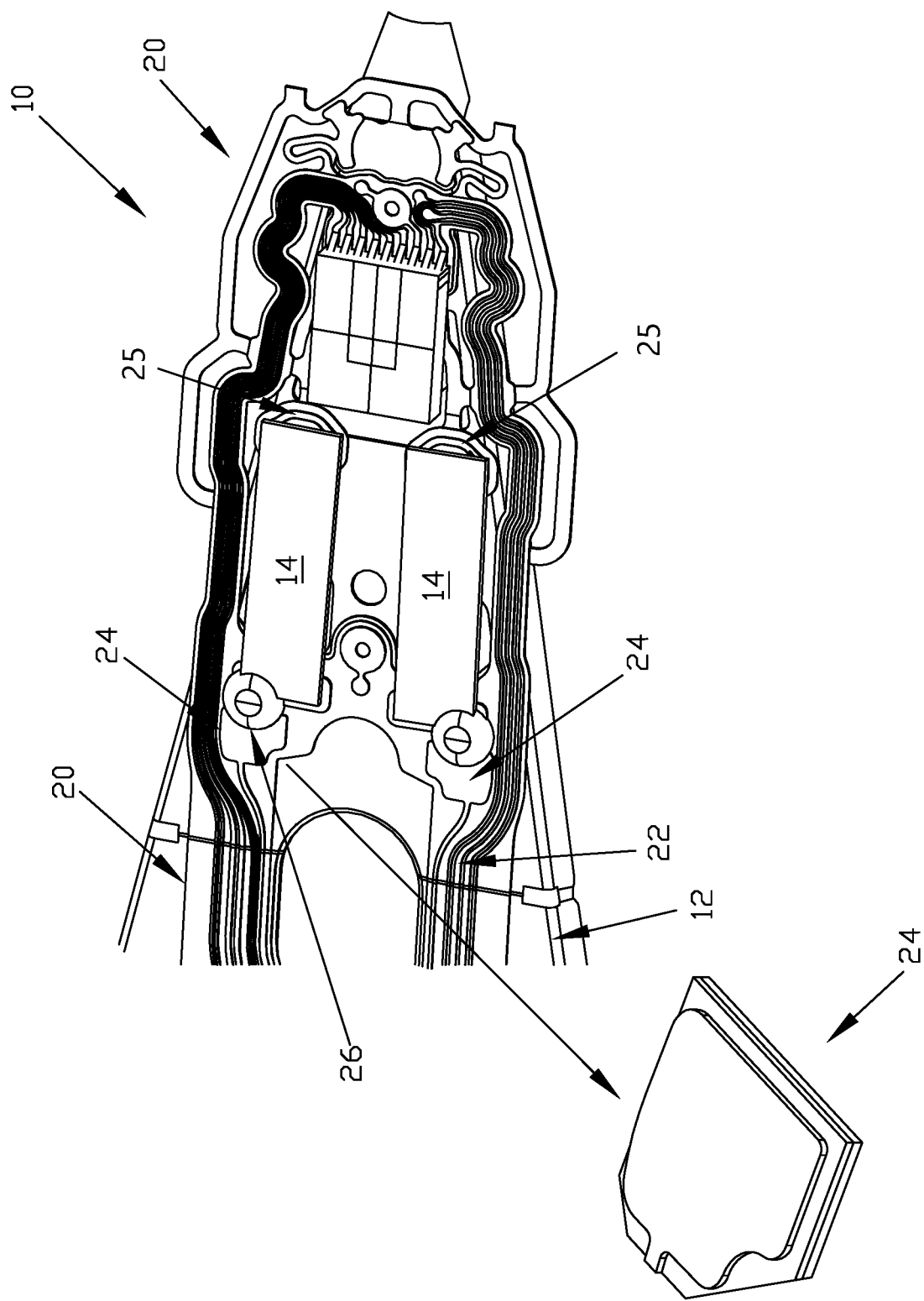
FIG. 1 illustrates a DSA suspension and a contact pad.

The embodiments of the present disclosure are described with reference to the attached figures, wherein like reference numerals are used throughout the figures to designate similar or equivalent elements. The figures are not drawn to scale, and they are provided as exemplary illustrations. Several aspects of the embodiments are described below with reference to example applications, which are not intended to limit the scope of this disclosure. It should be understood that numerous specific details, relationships, and methods are set forth to provide a full understanding of the embodiments.

One having ordinary skill in the relevant art, however, will readily recognize that the invention can be practiced without one or more of the specific details, or with other methods. In other instances, well-known structures or operations are not shown in detail to avoid obscuring the embodiments. Embodiments of the present disclosure are not limited by the illustrated ordering of acts or events, as some acts may occur in different orders and/or concurrently with other acts or events. Furthermore, not all illustrated acts or events are required to implement a methodology in accordance with the present invention.

FIG. 1 illustrates a DSA suspension 10. The DSA suspension 10 includes two piezoelectric microactuators (PZTs) 14 mounted near a gimbal. The gimbal allows the slider to pitch and roll so that it follows the proper data track on the disk, allowing for such variations as vibrations of the disk, inertial events such as bumping, and irregularities in the disk's surface. The PZTs 14 act directly on the gimbal through flexible connectors. Such suspensions are sometimes called gimbal DSA suspensions, or simply GSA suspensions. A GSA suspension is one type of DSA suspension. Other arrangements of GSA can be used to actuate suspensions, including, but not limited to, tri-stage actuated suspensions. In FIG. 1, the suspension 10 includes a flexure 20, which is mounted to a load beam 12. The flexure 20 includes an electrical circuit 22, which includes copper contact pads 24 configured to carry the PZT driving voltage. The electrical circuit 22 also includes copper contact pads 25, which are grounded. In some embodiments, an electrically conductive adhesive (ECA) is used to create an electrical bridge connecting the copper contact pad 24 to a top electrode of the PZTs 14.

During the assembly process, the ECA is cured at a high temperature. After the curing process, the epoxy component of the ECA will often shrink. This shrinkage ensures that the silver particle component of the ECA will be connected to the bonding surface for electrical connection. After the curing process, the DSA suspension 10 undergoes a series of tests to ensure maximum performance. One of these tests include an in-situ test, in which the DSA suspension 10 undergoes a high temperature cycle for up to 100 hours. During the in-situ test, the capacitance and resistance are monitored to ensure that good electrical connection is maintained during the test. Thus, it is imperative to maintain a stable electrical connection for the PZT 14. Joint 26, located between the ECA and the copper contact pad 24, is typically prone to in-situ failure.

Figure 2A:
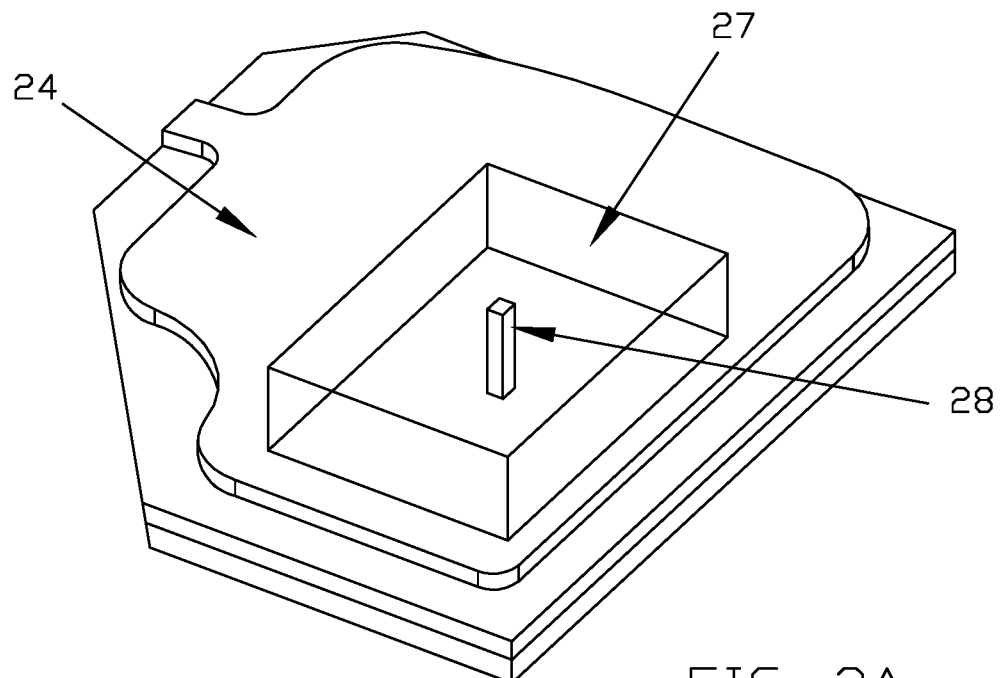
FIG. 2A illustrates the contact pad in further detail.
Figure 2B:
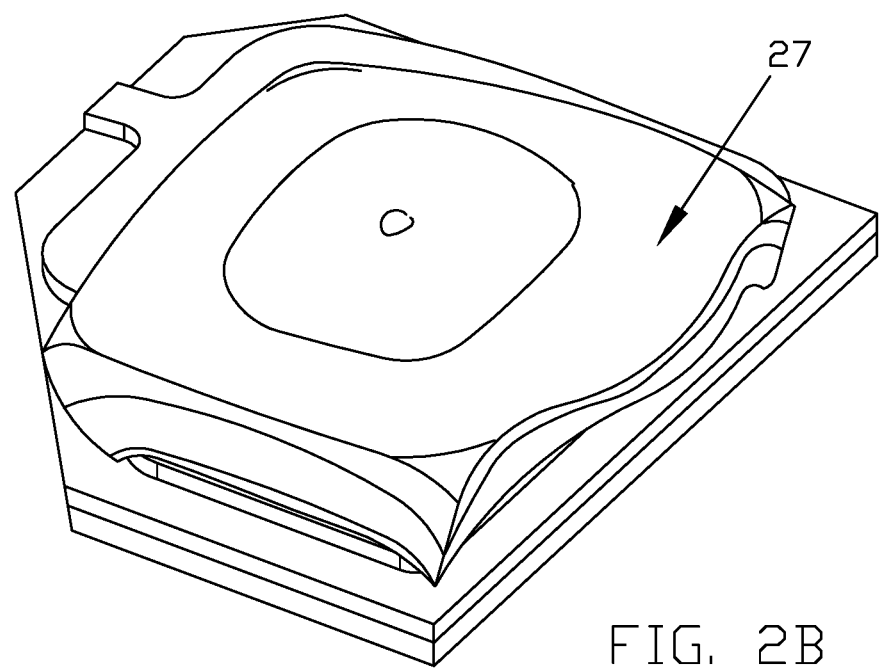
FIG. 2B illustrates thermal expansion of an epoxy on the contact pad in further detail.

FIGS. 2A and 2B illustrate the copper contact pad 24 in further detail. The copper contact pad 24 can include an epoxy 27 and an exemplary silver component 28. The exemplary silver component 28 is simplified for the current disclosure to illustrate the contact with the copper contact pad 24. As shown in FIG. 2A, the exemplary silver component 28 is surrounded by the epoxy 27. The high temperature during the in-situ test causes thermal expansion of the epoxy 27 of the ECA. This thermal expansion tends to pull the exemplary silver component 28 from the copper contact pad 24. This separation between the exemplary silver component 28 and the copper contact pad 24 causes an electrical disconnection when the pulling force is large enough at high temperature.

FIG. 2B illustrates the thermal expansion of the epoxy 27. The exemplary silver component 28 is pulled away from the copper contact pad 24. In some embodiments, the average contact pressure between the exemplary silver component 28 and the copper contact pad 24 is −4.55 MPa. To alleviate the electrical disconnection, the present disclosure provides various connections between an exemplary conductive component and a contact pad that withstand thermal expansion.

Figure 3:
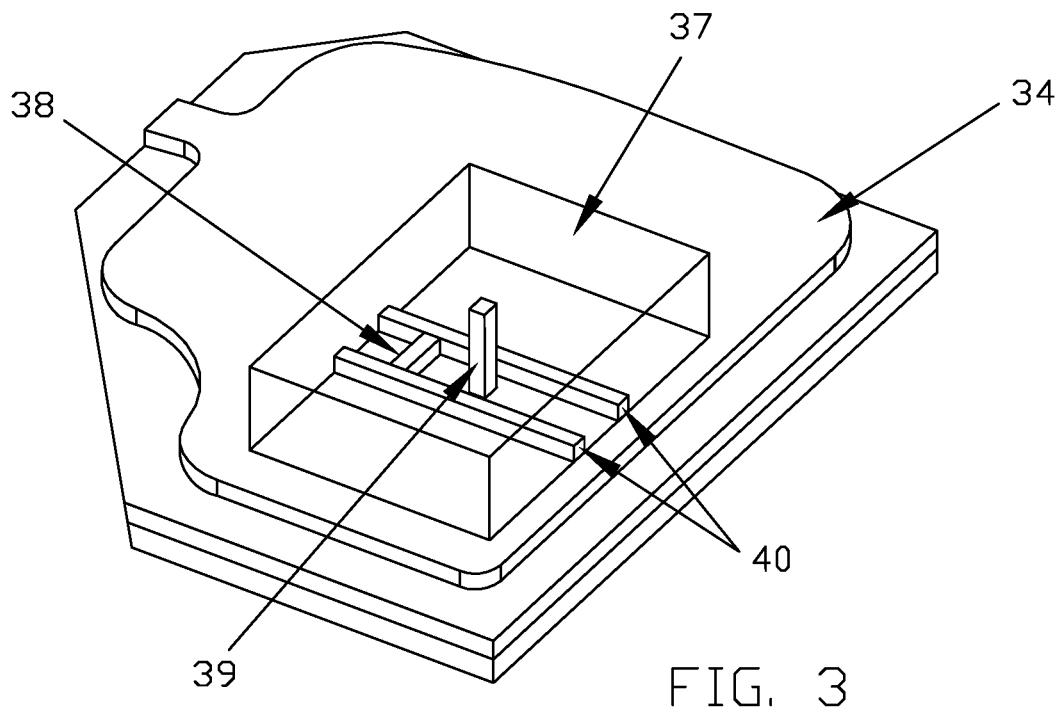
FIG. 3 illustrates a contact pad, in accordance with an embodiment of the disclosure.

FIG. 3 illustrates a contact pad 34 in accordance with an embodiment of the disclosure. The contact pad 34 can include an epoxy 37 and exemplary conductive components 38 and 39. For some embodiments, the contact pad 34 is formed as a copper contact pad. However, other conductive materials could be used. For some embodiments, the conductive components 38 and 39 are formed of silver. However, other conductive materials could be used to form the conductive components described herein. The contact pad 34 can also include additional trace features 40 that create a rough surface for the copper contact pad 34. The exemplary conductive components 38 and 39 are illustrated in a simplified format in the current disclosure to illustrate the contact with the copper contact pad 34. The exemplary conductive components 38 and 39 are surrounded by the epoxy 37.

The additional copper trace features 40 can be implemented on top of the contact pad 34 to promote electrical contact with the side walls of the copper trace features 40 and the exemplary conductive components 38 and 39. This additional side wall electrical contact reduces the thermal expansion effect during high temperature cycle. The additional trace features 40 can also provide more constraints to the epoxy 37 and the exemplary conductive components 38 and 39. According to some embodiments, the trace features are formed of copper. However, other conductive materials could be used. This constraint reduces the pulling force away from the contact pad 34 at high temperatures.

Furthermore, the contact between the additional trace features 40 and the silver 38 provides a shearing tendency, which maintains electrical contact when the thermal force is causing the conductive components 38 and 39 to pull away from the contact pad 34.

Table 1 illustrates the effect of having the additional trace features 40 on the contact pressure between the exemplary conductive components 38 and 39 and the contact pad 34 according to some embodiment. The negative pressure represents the tendency of pulling away from the contact pad 34 at high temperature during an in-situ test. The horizontal conductive component 38 connection to the sidewall is most effective when the additional trace features 40 are thicker.

TABLE 1

Modelling Results

| | Contact Pressure (MPa) | | |
|---|---|---|---|
| Cu trace height | 10 um | 5 um | 2 um |
| Vertical silver connection | −2.85 | −3.92 | −4.22 |
| Horizontal silver connection | −0.6 | −1.4 | −4.36 |

Figure 4:
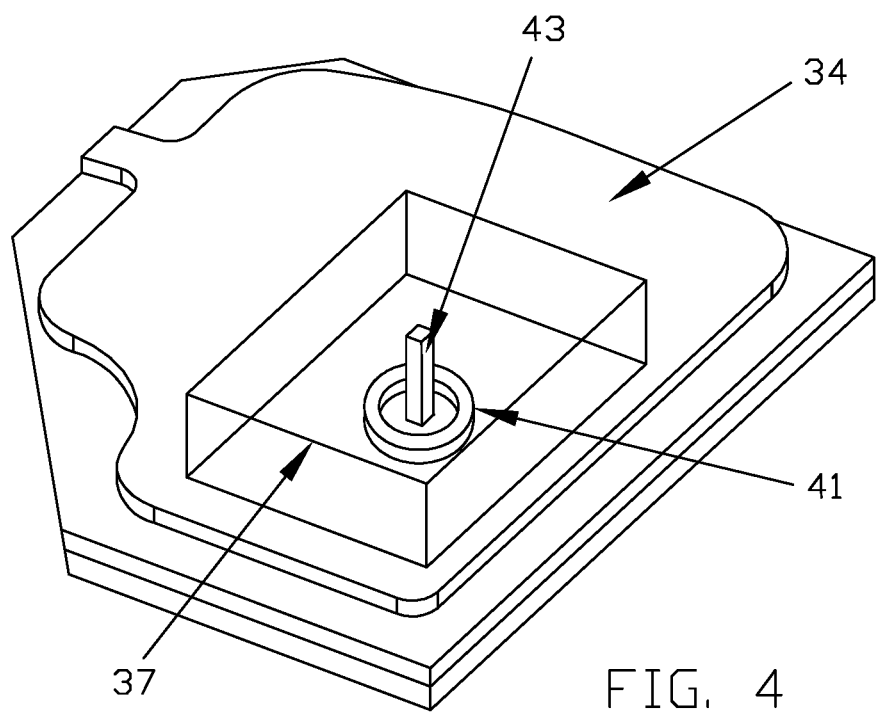
FIG. 4 illustrates a circular trace feature on top of a contact pad, in accordance with an embodiment of the disclosure.

It should be understood that other configurations of the additional trace features 40 can be implemented to achieve similar results. For example, FIG. 4 illustrates a circular trace feature 41 on top of the copper contact pad 34. According to some embodiments, the trace features are formed of copper. However, other conductive materials could be used. The circular trace feature 41 can surround a vertical conductive component 43. The circular trace feature 41 can provide constraints to the epoxy 37 and the vertical conductive component 43. This constraint reduces the pulling force of the vertical conductive component 43 away from the contact pad 34 at high temperatures.

Figure 5:
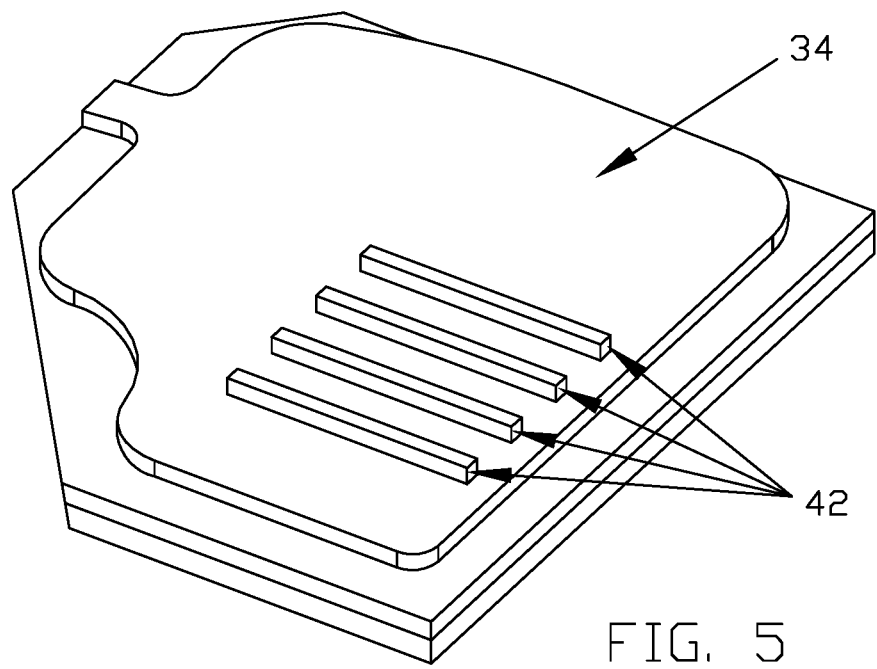
FIG. 5 illustrates a grid of trace features within a contact pad, in accordance with an embodiment of the disclosure.

FIG. 5 illustrates a grid of trace features 42 within the contact pad 34. Similar to the embodiment discussed in FIG. 3, the grid of copper trace features 42 can be on the contact pad 34 to promote electrical contact with the side walls of the trace features 42 and the exemplary conductive components. Electrical contact with side wall has shearing tendency during thermal expansion, which maintains electrical contact as the thermal force is to pull away from pad 34. This additional trace features 42 reduce the thermal expansion effect during high temperature. The grid of trace features 42 can also provide more constraints to the epoxy and the exemplary conductive components. This constraint reduces the pulling force away from the contact pad 34 at high temperatures.

Alternatively, instead of adding additional trace features on top of the contact pad 34, a similar result can be achieved by creating a depression or subtraction of the contact pad 34. FIGS. 6-9 provide exemplary illustrations of these alternative embodiments.

Figure 6:
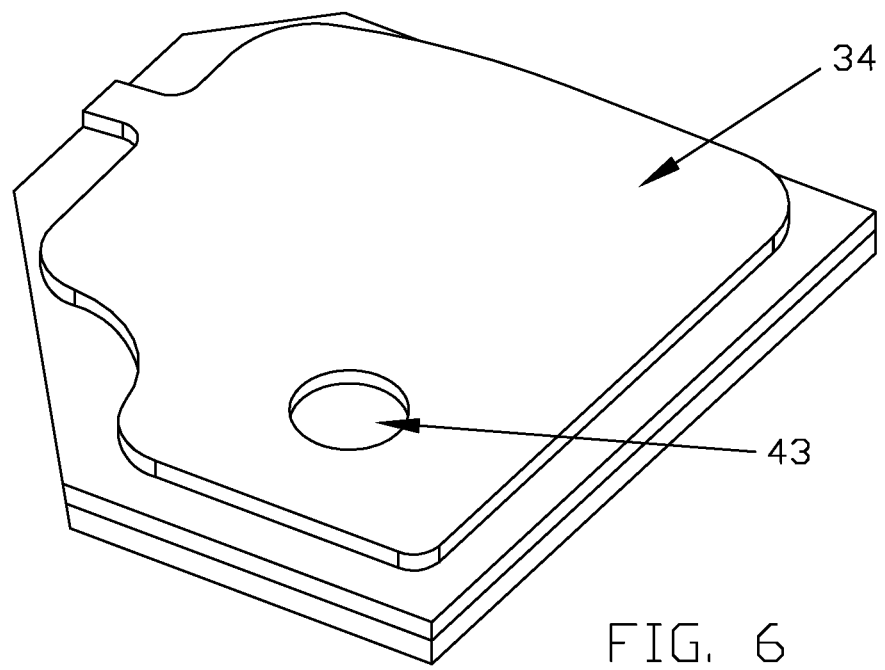
FIG. 6 illustrates a circular depression feature within a contact pad, in accordance with an embodiment of the disclosure.

FIG. 6 illustrates a circular depression feature 43 within the copper contact pad 34. The circular depression feature 43 can be implemented to promote electrical contact with the side walls of the circular depression feature 43 and the exemplary conductive components. This additional electrical contact reduces the thermal expansion effect during high temperature. The circular depression feature 43 can also provide more constraints to the epoxy and the exemplary conductive components. This constraint reduces the pulling force away from the contact pad 34 at high temperatures.

Figure 7:
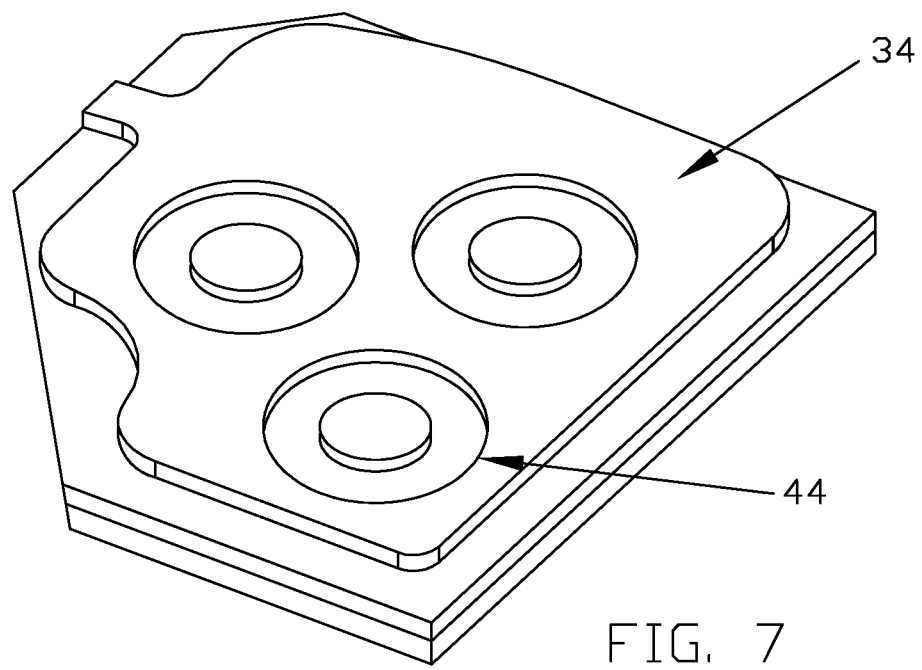
FIG. 7 illustrates a torus depression feature within a contact pad, in accordance with an embodiment of the disclosure.

FIG. 7 illustrates a torus depression feature 44 within the copper contact pad 34. The torus depression feature 44 can be implemented to promote electrical contact with the side walls of the torus depression feature 44 and the exemplary conductive components (also not shown). This depression feature 44 reduces the thermal expansion effect during high temperature cycle. The torus depression feature 44 can also provide more constraints to the epoxy and the exemplary conductive components. This constraint reduces the pulling force away from the contact pad 34 at high temperatures.

Figure 8:
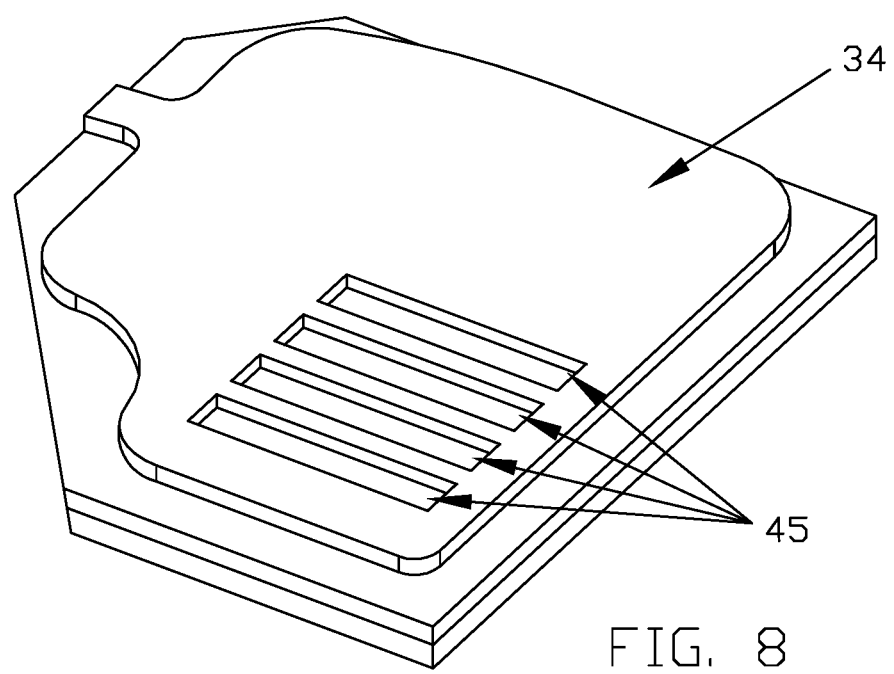
FIG. 8 illustrates elongated depression features within a contact pad, in accordance with an embodiment of the disclosure.

FIG. 8 illustrates elongated depression features 45 within the contact pad 34. The elongated depression features 45 can be implemented to promote electrical contact with the side walls of the elongated depression features 45 and the exemplary conductive components. This elongated depression features 45 reduces the thermal expansion effect during high temperature cycle. The elongated depression features 45 can also provide more constraints to the epoxy and the exemplary conductive components. This constraint reduces the pulling force away from the contact pad 34 at high temperatures.

Figure 9:
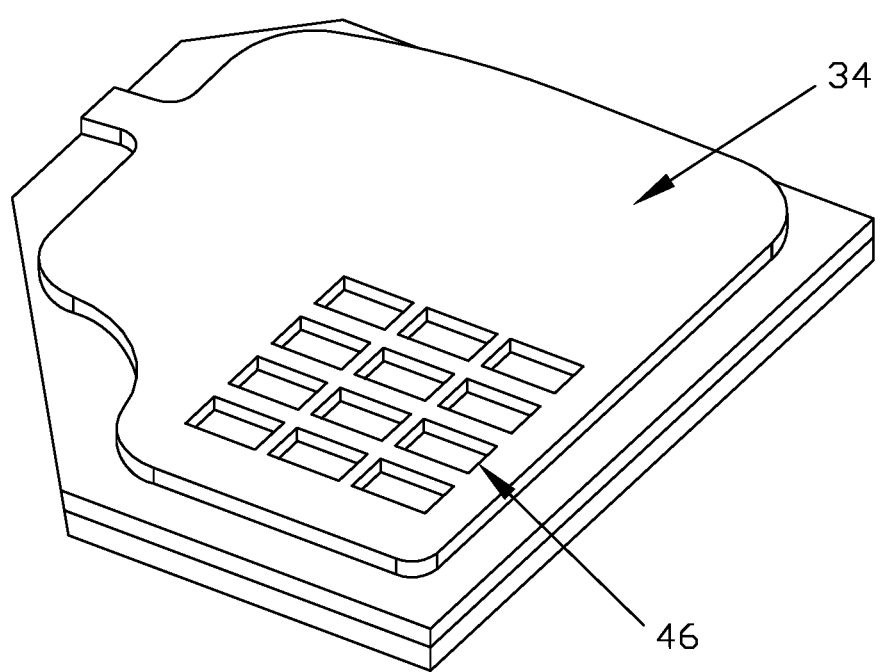
FIG. 9 illustrates multiple depression features within a contact pad, in accordance with an embodiment of the disclosure.

FIG. 9 illustrates multiple depression features 46 within the copper contact pad 34. The multiple depression features 46 can be implemented as a grid of elongated depressions to promote electrical contact with the side walls of the multiple depression features 46 and the exemplary conductive components. This multiple depression features 46 reduce the thermal expansion effect during high temperature cycle. The multiple depression features 46 can also provide more constraints to the epoxy and the exemplary conductive components. This constraint reduces the pulling force away from the contact pad 34 at high temperatures.

It should be understood that other configurations and shapes of depression features can be implemented herein.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. An electrical connection structure for connecting a piezoelectric element and an electrical circuit to each other with a conductive adhesive, the electrical connection structure comprising:
   a metallic contact pad;
   an epoxy disposed over the metallic contact pad;
   at least one conductive component surrounded by the epoxy; and
   at least one depression feature formed in the metallic contact pad, the at least one depression feature is in electrical contact with the at least one conductive component and configured to reduce thermal expansion, and the at least one depression feature is configured to constrain the epoxy and the at least one conductive component.

2. The electrical connection structure of claim 1, wherein the at least one depression feature includes a circular depression feature.

3. The electrical connection structure of claim 1, wherein the at least one depression feature includes more than one torus depression features.

4. The electrical connection structure of claim 1, wherein the at least one depression feature includes more than two elongated depression features arranged alongside one another.

5. The electrical connection structure of claim 1, wherein the at least one depression feature includes more than two elongated depression features arranged in a grid layout.

\* \* \* \* \*